(12) United States Patent
Kim et al.

(10) Patent No.: US 7,777,336 B2
(45) Date of Patent: Aug. 17, 2010

(54) METAL LINE OF SEMICONDUCTOR DEVICE AND METHOD FOR FORMING THE SAME

(75) Inventors: Jeong Tae Kim, Gyeonggi-do (KR);
Seung Jin Yeom, Gyeonggi-do (KR);
Baek Mann Kim, Gyeonggi-do (KR);
Dong Ha Jung, Gyeonggi-do (KR);
Joon Seok Oh, Gyeonggi-do (KR); Nam Yeal Lee, Daejeon (KR); Jae Hong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/329,718

(22) Filed: Dec. 8, 2008

(65) Prior Publication Data
US 2009/0283908 A1  Nov. 19, 2009

(30) Foreign Application Priority Data
May 16, 2008   (KR) ...................... 10-2008-0045586

(51) Int. Cl.
*H01L 21/48* (2006.01)
(52) U.S. Cl. ............... 257/751; 257/197; 257/E21.584; 257/E23.16; 438/627; 438/643; 438/653
(58) Field of Classification Search .............. 257/734, 257/E21.197, E21.198, E21.199, E21.2, E21.201, 257/E21.202, E21.203, E21.204, 751
See application file for complete search history.

(56) References Cited

U.S. PATENT DOCUMENTS

| 2002/0197856 | A1* | 12/2002 | Matsuse et al. ............. 438/652 |
| 2003/0057445 | A1* | 3/2003 | Kweon et al. ............... 257/200 |
| 2008/0237859 | A1* | 10/2008 | Ishizaka et al. ............. 257/751 |
| 2009/0008620 | A1* | 1/2009 | Baek et al. ..................... 257/2 |

FOREIGN PATENT DOCUMENTS

KR   10-0224721 B1   7/1999

* cited by examiner

*Primary Examiner*—Davienne Monbleau
*Assistant Examiner*—Farid Khan
(74) *Attorney, Agent, or Firm*—Ladas & Parry LLP

(57) ABSTRACT

A metal line of a semiconductor device includes an insulation layer formed on a semiconductor substrate and a metal line forming region is formed in the insulation layer. A diffusion barrier is formed on a surface of the metal line forming region of the insulation layer, and the diffusion layer has a multi-layered structure of an Ru layer, an $Ru_xO_y$ layer, an $Ir_xO_y$ layer, and a Ti layer. A metal layer is formed on the diffusion barrier to fill the metal line forming region of the insulation layer.

23 Claims, 5 Drawing Sheets

METAL LINE OF SEMICONDUCTOR DEVICE AND METHOD FOR FORMING THE SAME

CROSS-REFERENCE TO RELATED APPLICATIONS

The present application claims priority to Korean patent application number 10-2008-0045586 filed on May 16, 2008, which is incorporated herein by reference in its entirety.

BACKGROUND OF THE INVENTION

The present invention relates generally to a metal line of a semiconductor device and a method for forming the same, and more particularly, to a metal line of a semiconductor device that can improve the characteristics of a diffusion barrier and can thereby improve the characteristics and the reliability of a semiconductor device and a method for forming the same.

In a semiconductor device, metal lines are formed to electrically connect elements or lines with each other. Contact plugs are formed to connect lower metal lines and upper metal lines with each other. As the integration level of the semiconductor device continues to increase, the aspect ratio of a contact hole, in which a contact plug is formed, gradually increases. As a result, the difficulty and the importance of a process for forming the metal line and the contact plug have been noted.

The metal line of a semiconductor device is usually formed of aluminum or tungsten because both have good electrical conductivity. Copper is being studied as a potential next-generation material for a metal line because copper has excellent electrical conductivity and low resistance when compared to aluminum and tungsten. Forming the metal line of a semiconductor device with copper (Cu) can therefore solve the problems associated with conventional metal lines of highly integrated semiconductor devices having high operating speed such as RC signal delay.

It is difficult to dry etch copper into a wiring pattern, and therefore, to form a metal line using copper, a damascene process is employed. In the damascene metal line forming process, a damascene pattern is formed by etching an interlayer dielectric, and a metal line is formed by filling a copper layer in the damascene pattern. The damascene process can be a single damascene process or a dual damascene process.

When applying the damascene process, in a multi-layered metal line, an upper metal line and a contact plug for connecting the upper metal line and a lower metal line can be simultaneously formed. Also, since surface undulations that are produced due to the presence of the metal line can be removed, a subsequent process can be conveniently conducted.

Further, in the case of using copper as the material for the metal line, as opposed to the case of using aluminum, copper diffuses to a semiconductor substrate through the interlayer dielectric. The diffused copper acts as deep-level impurities in the semiconductor substrate made of silicon and induces leakage current. Therefore, it is necessary to form a diffusion barrier at an interface between a copper layer and the interlayer dielectric. Generally, the diffusion barrier is made of a Ta layer or a TaN layer.

However, in the conventional art as described above, when manufacturing a highly integrated semiconductor device, the characteristics of the diffusion barrier made of the Ta layer or the TaN layer are likely to deteriorate, and leakage current is likely to be induced, and as a result, the characteristics and the reliability of the semiconductor device are degraded. Thickness of the diffusion barrier may be increased to improve the characteristics of the diffusion barrier, however, when the diffusion barrier thickness is increased the contact resistance increases as well. This increase in the contact resistance is not desirable.

SUMMARY OF THE INVENTION

Embodiments of the present invention are include a metal line of a semiconductor device which can improve the characteristics of a diffusion barrier and a method for forming the same.

Also, embodiments of the present invention include a metal line of a semiconductor device which can improve the characteristics and the reliability of a semiconductor device and a method for forming the same.

In one embodiment of the present invention, a metal line of a semiconductor device comprises an insulation layer formed on a semiconductor substrate and having a metal line forming region; a diffusion barrier formed on a surface of the metal line forming region of the insulation layer and having a multi-layered structure of an Ru layer, an $Ru_xO_y$ layer, an $Ir_xO_y$ layer and a Ti layer; and a metal layer formed on the diffusion barrier to fill the metal line forming region of the insulation layer.

The Ru layer has a thickness of 3~25 Å.
The $Ru_xO_y$ layer has a thickness of 2~25 Å.
The $Ir_xO_y$ layer has a thickness of 5~100 Å.
The Ti layer has a thickness of 5~50 Å.
In the $Ru_xO_y$ layer, x has a range of 0.1~0.5 and y has a range of 0.5~0.9.
In the $Ir_xO_y$ layer, x has a range of 0.1~0.5 and y has a range of 0.5~0.9.
The metal layer comprises a copper layer.

In another embodiment of the present invention, a method for forming a metal line of a semiconductor device comprises the steps of forming an insulation layer which has a metal line forming region, over a semiconductor substrate; forming a diffusion barrier which has a multi-layered structure of an Ru layer, an $Ru_xO_y$ layer, an $Ir_xO_y$ layer and a Ti layer, on the insulation layer including a surface of the metal line forming region; and forming a metal layer on the diffusion barrier to fill the metal line forming region.

The step of forming the diffusion barrier comprises the steps of forming an Ru layer on the insulation layer including a surface of the metal line forming region; forming an Ir layer on the Ru layer; forming a multi-layered structure comprising the Ru layer, an $Ru_xO_y$ layer and an $Ir_xO_y$ layer by oxidating the Ir layer and a surface of the Ru layer; and forming a Ti layer on the $Ir_xO_y$ layer.

The Ru layer is formed to have a thickness of about 5~50 Å.
The Ir layer is formed to have a thickness of about 5~50 Å.
Oxidation of the Ir layer and the Ru layer is conducted through annealing.
The annealing is conducted under an oxygen atmosphere.
The annealing is conducted at a temperature of 300~500° C.
The annealing is conducted under pressure of 1~760 Torr.
The annealing is conducted for 1~100 seconds.
The annealing is conducted using oxygen of 1~500 sccm and argon gas of 100~1,000 sccm.
The $Ru_xO_y$ layer is formed to have a thickness of 2~25 Å.
The $Ru_xO_y$ layer is formed as a layer in which x has a range of 0.1~0.5 and y has a range of 0.5~0.9.
The $Ir_xO_y$ layer is formed to have a thickness of 5~100 Å.

The $Ir_xO_y$ layer is formed as a layer in which x has a range of 0.1~0.5 and y has a range of 0.5~0.9.

The Ti layer is formed to have a thickness of 5~50 Å.

The metal layer comprises a copper layer.

DESCRIPTION OF SPECIFIC EMBODIMENTS

In the present invention, when forming a metal line using a copper layer, the characteristics of the diffusion barrier can be improved by forming a diffusion barrier having a multi-layered structure including an Ru layer, an $Ru_xO_y$ layer, an $Ir_xO_y$ layer, and a Ti layer. Accordingly, in the present invention, it is possible to prevent the constituent of the copper layer from diffusing since the characteristics of the diffusion barrier are improved, and therefore, the characteristics and the reliability of a semiconductor device can be improved.

Hereafter, the specific embodiments of the present invention will be described in detail with reference to the attached drawings.

Figure 1:
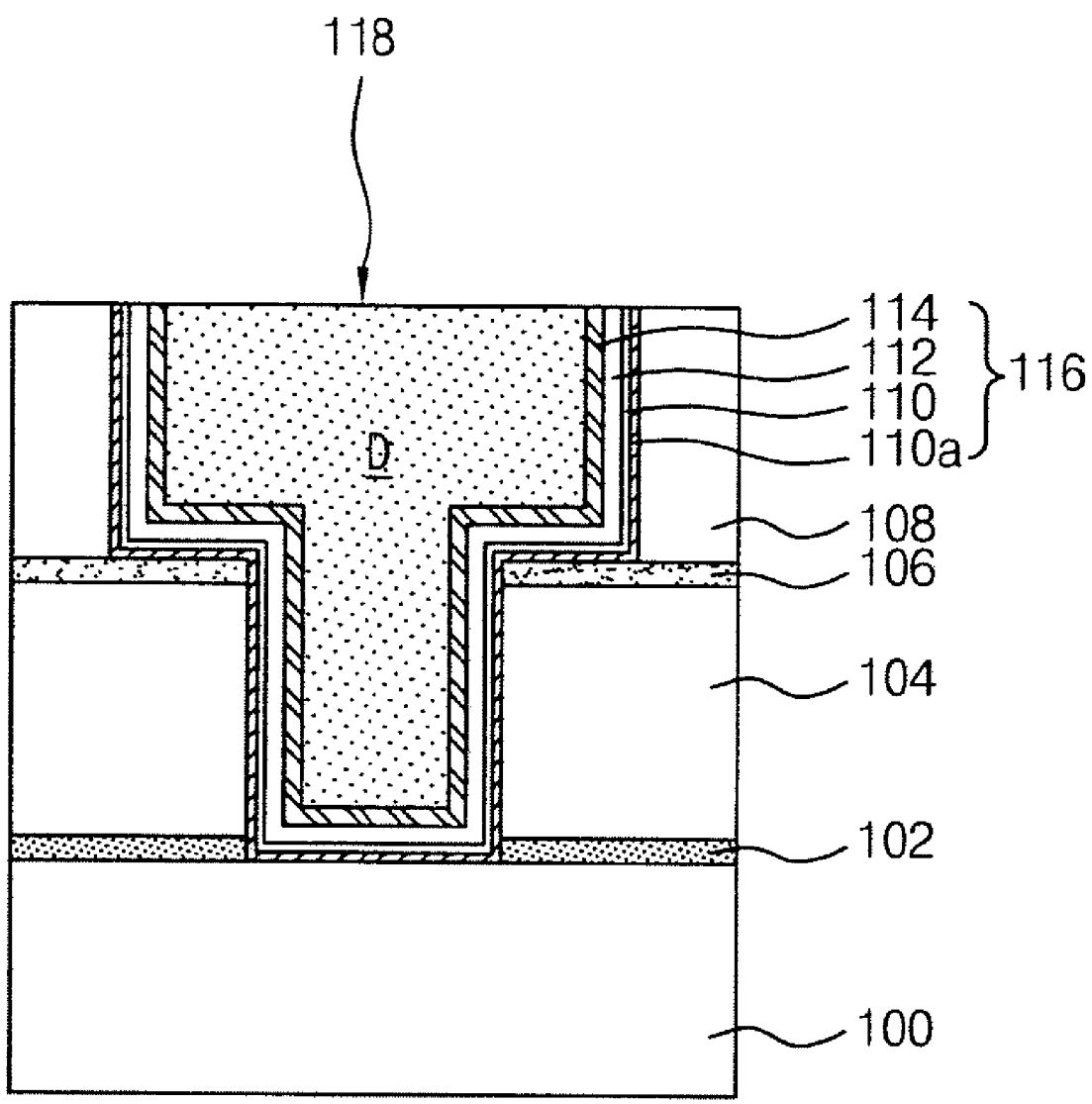
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, first and second insulation layers 104 and 108 are formed over a semiconductor substrate 100 to define a metal line forming region D. The semiconductor substrate is formed to have a predetermined understructure (not shown). The predetermined understructure is any one among a gate, a junction region or a lower metal line. A first etch stop layer 102 is formed between the semiconductor substrate 100 and the first insulation layer 104, and a second etch stop layer 106 is formed between the first insulation layer 104 and the second insulation layer 108. The metal line forming region D can be defined through a single damascene process or a dual damascene process to have a trench structure or a trench and via-hole structure, which has a trench and at least one via-hole communicating with the trench.

A diffusion barrier 116 is formed on the surface of the metal line forming region D, which is defined in the first and second insulation layers 104 and 108, and the diffusion barrier 116 is formed to have a multi-layered structure of an Ru layer 110a, an $Ru_xO_y$ layer 110, an $Ir_xO_y$ layer 112, and a Ti layer 114. The Ru layer 110a of the diffusion barrier 116 has a thickness in the range of 3~25 Å. The $Ru_xO_y$ layer 110 of the diffusion barrier 116 has a thickness in the range of 2~25 Å, and, in the $Ru_xO_y$ layer 110, x has a range of 0.1~0.5 and y has a range of 0.5~0.9. The $Ir_xO_y$ layer 112 of the diffusion barrier 116 has a thickness in the range of 5~100 Å, and, in the $Ir_xO_y$ layer 112, x has a range of 0.1~0.5 and y has a range of 0.5~0.9. The Ti layer 114 of the diffusion barrier 116 has a thickness in the range of 5~50 Å.

A metal line 118 is formed on the diffusion barrier 116 to fill the metal line forming region D defined in the first and second insulation layers 104 and 108. The metal line 118 comprises a copper layer.

The metal line 118 according to the present embodiment includes the diffusion barrier 116, which has the multi-layered structure of the Ru layer 110a, the $Ru_xO_y$ layer 110, the $Ir_xO_y$ layer 112, and the Ti layer 114 each of which are formed between the copper layer and the first and second insulation layers 104 and 108. Therefore, in the present invention, it is possible to effectively prevent the copper layer from diffusing. Accordingly, in the present invention, the characteristics of the diffusion barrier 116 can be improved even without increasing the thickness of the diffusion barrier 116 when compared to the conventional art. As a result, in the present invention, the characteristics and the reliability of a semiconductor device can be improved.

FIGS. 2A through 2H are cross-sectional views showing the processes of a method for forming a metal line of a semiconductor device in accordance with another embodiment of the present invention.

Figure 2A:
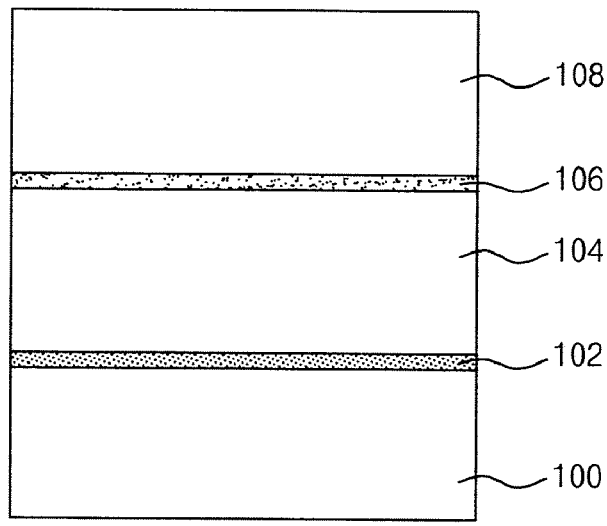
FIGS. 2A through 2H are cross-sectional views showing the processes of a method for forming a metal line of a semiconductor device in accordance with another embodiment of the present invention.

Referring to FIG. 2A, first and second insulation layers 104 and 108 are sequentially formed on a semiconductor substrate 100 which is formed with a predetermined understructure (not shown), to cover the understructure. Preferably, a first etch stop layer 102 and a second etch stop layer 106 are formed between the semiconductor substrate 100 and the first insulation layer 104 and between the first insulation layer 104 and the second insulation layer 108, respectively. The first and second etch stop layers 102 and 106 comprise, for example, SiN layers.

Figure 2B:
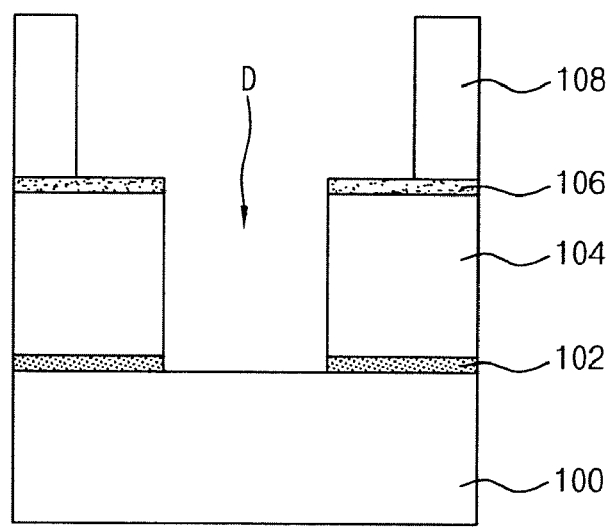

Referring to FIG. 2B a metal line forming region D is defined by etching the second insulation layer 108, the second etch stop layer 106, the first insulation layer 104, and the first etch stop layer 102. The metal line forming region D can be defined through a single damascene process or a dual damascene process to have a trench structure or a trench and via-hole structure which has a trench and at least one via-hole communicating with the trench.

Figure 2C:
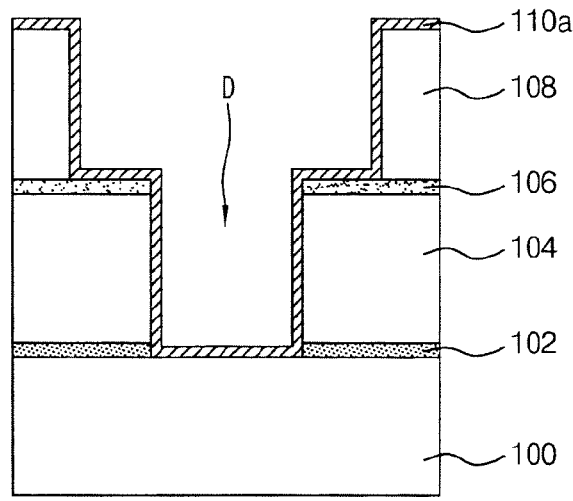

Referring to FIG. 2C, an Ru layer 110a is formed on the second insulation layer 108 and the surface of the metal line forming region D. The Ru layer 110a is formed to have a thickness in the range of 5~50 Å.

Figure 2D:
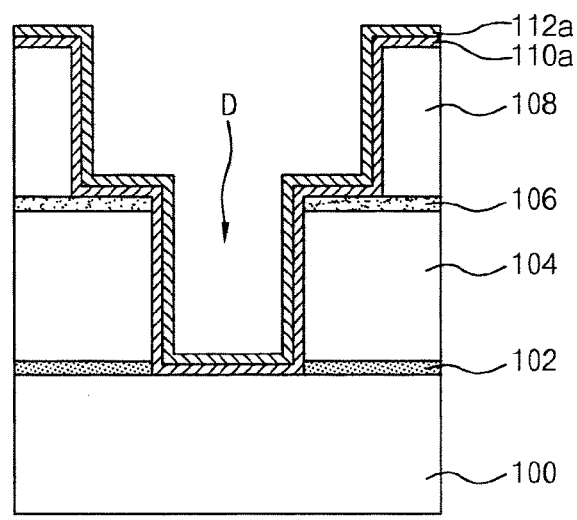

Referring to FIG. 2D, an Ir layer 112a is formed on the Ru layer 110a. The Ir layer 112a is formed to have a thickness in the range of 5~50 Å.

Figure 2E:
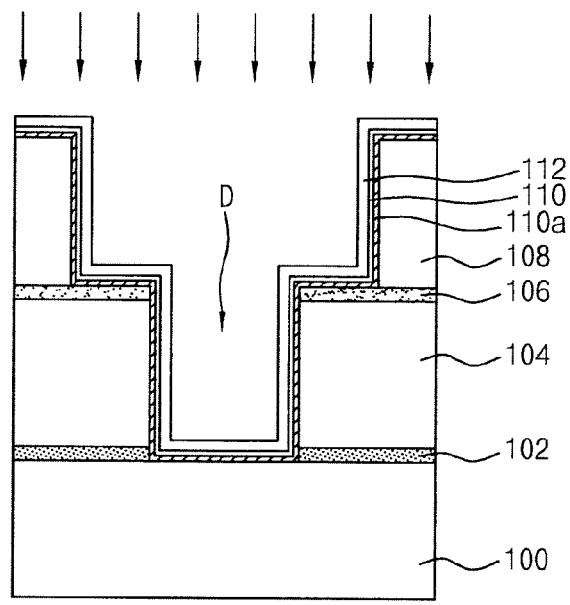

Referring to FIG. 2E, the resultant semiconductor substrate 100 formed with the Ir layer 112a and the Ru layer 110a is annealed under an oxygen atmosphere. The annealing results in the oxidation of the Ir layer 112a and the surfaces of the Ru layer 110a such that an $Ru_xO_y$ layer 110 and an $Ir_xO_y$ layer 112 are formed on the Ru layer 110a. The annealing is conducted at a temperature in the range of 300~500° C. under a pressure in the range of 1~760 Torr for a duration of 1~100 seconds. Preferably the annealing is conducted, using oxygen in the range of 1~500 sccm and argon gas in the range of 100~1,000 sccm.

Here, the $Ru_xO_y$ layer 110 has a thickness of in the range of 2~25 Å, and x has a range of 0.1~0.5 and y has a range of 0.5~0.9. The $Ir_xO_y$ layer 112 has a thickness in the range of 5~100 Å, and x has a range of 0.1~0.5 and y has a range of 0.5~0.9.

Figure 2F:
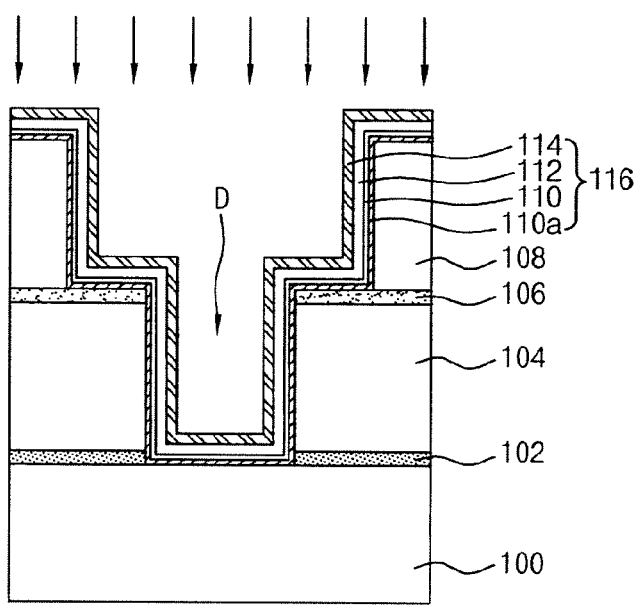

Referring to FIG. 2F, a Ti layer 114 is formed on the $Ir_xO_y$ layer 112. The Ti layer 114 is formed to have a thickness in the range of 5~50 Å. As a result, a diffusion barrier 116, which has a multi-layered structure of the Ru layer 110a, the $Ru_xO_y$ layer 110, the $Ir_xO_y$ layer 112, and the Ti layer 114, is formed on the second insulation layer 108 and the surface of the metal line forming region D.

Figure 2G:
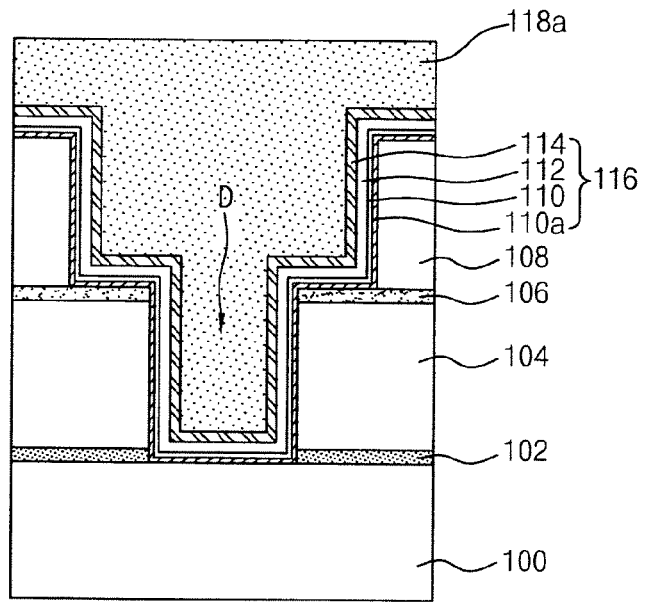

Referring to FIG. 2G, a metal layer 118a is formed on the diffusion barrier 116 to fill the metal line forming region D. The metal layer 118a comprises, preferably, a copper layer.

Figure 2H:
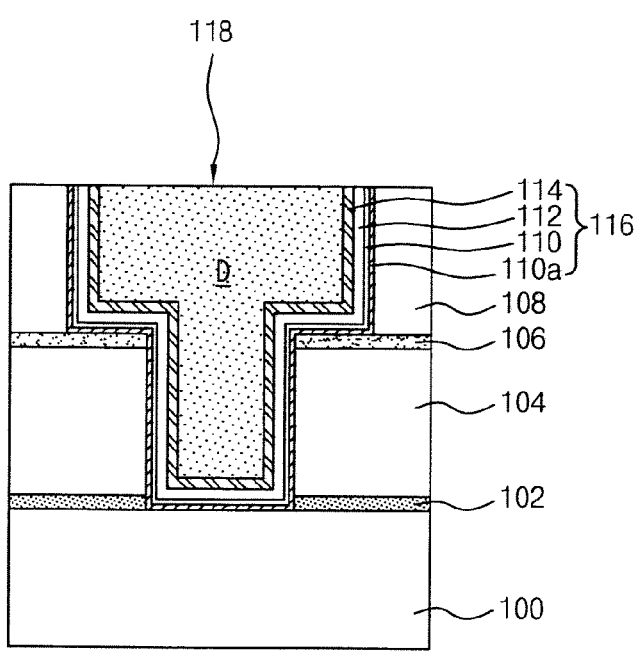

Referring to FIG. 2H, a metal line 118 is formed to fill the metal line forming region D by chemical mechanical polishing (CMPing) the metal layer 118a and the diffusion barrier 116 until the second insulation layer 108 is exposed.

Thereafter, while not shown in the drawings, by sequentially conducting a series of well-known subsequent processes, the formation of the metal line of a semiconductor device according to the embodiment of the present invention is completed.

As is apparent from the above description, in the present invention, when forming a metal line using copper, a diffusion barrier having a multi-layered structure of an Ru layer, an $Ru_xO_y$ layer, an $Ir_xO_y$ layer, and a Ti layer is formed. Therefore, the characteristics of the diffusion barrier can be improved even without increasing the thickness of the diffusion barrier when compared to the conventional art. Through this, in the present invention, it is possible to prevent the constituent of a copper layer from diffusing to an insulation layer, and leakage current and contact resistance can be decreased. Accordingly, in the present invention, the characteristics and the reliability of a semiconductor device can be improved.

Also, in the present invention, the characteristics of a semiconductor device, including those of a metal line, can be effectively improved because the diffusion of the constituent of the copper layer can be prevented by the diffusion barrier, which has a decreased thickness when compared to the conventional art, for example, corresponding to ½ of the thickness of the conventional diffusion barrier.

Although specific embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A metal line of a semiconductor device, comprising:
    an insulation layer formed over a semiconductor substrate and having a metal line forming region;
    a diffusion barrier layer formed on a surface of the metal line forming region of the insulation layer and having a multi-layered structure comprising an Ru layer, an $Ru_xO_y$ layer, an $Ir_xO_y$ layer, and a Ti layer,
    wherein the Ru layer, the $Ru_xO_y$ layer, the $Ir_xO_y$ layer and the Ti layer are formed on a surface of the insulation layer in sequence; and
    a metal layer formed on the diffusion barrier layer in the metal line forming region of the insulation layer.

2. The metal line according to claim 1, wherein the Ru layer has a thickness of 3 to 25 Å.

3. The metal line according to claim 1, wherein the $Ru_xO_y$ layer has a thickness in the range of 2 to 25 Å.

4. The metal line according to claim 1, wherein the $Ir_xO_y$ layer has a thickness in the range of 5 to 100 Å.

5. The metal line according to claim 1, wherein the Ti layer has a thickness in the range of 5 to 50 Å.

6. The metal line according to claim 1, wherein, in the $Ru_xO_y$ layer, x has a range of 0.1 to 0.5 and y has a range of 0.5 to 0.9.

7. The metal line according to claim 1, wherein, in the $Ir_xO_y$ layer, x has a range of 0.1 to 0.5 and y has a range of 0.5 to 0.9.

8. The metal line according to claim 1, wherein the metal layer comprises a copper layer, and the metal layer fills the metal line forming region.

9. A method for forming a metal line of a semiconductor device, comprising the steps of:
    forming an insulation layer having a metal line forming region, on a semiconductor substrate;
    forming an Ru layer on the insulation layer and a surface of the metal line forming region;
    forming an Ir layer on the Ru layer;
    forming multi-layered structure comprising the Ru layer, an $Ru_xO_y$ layer and an $Ir_xO_y$ layer by oxidizing the Ir layer and a surface of the Ru layer;
    forming a Ti layer on the $Ir_xO_y$ layer, so that a diffusion barrier layer having a multi-layered structure comprising the Ru layer, the $Ru_xO_y$ layer, the $Ir_xO_y$ layer and the Ti layer is formed on the insulation layer including a surface of the metal line forming region, wherein the Ru layer, the $Ru_xO_y$ layer, the $Ir_xO_y$ layer and the Ti layer are formed on a surface of the insulation layer in sequence; and
    forming a metal layer on the diffusion barrier layer in the metal line forming region.

10. The method according to claim 9, wherein the Ru layer is formed to have a thickness in the range of 5 to 50 Å.

11. The method according to claim 9, wherein the Ir layer is formed to have a thickness in the range of 5 to 50 Å.

12. The method according to claim 9, wherein oxidation of their layer and the Ru layer is conducted through annealing.

13. The method according to claim 12, wherein the annealing is conducted under an oxygen atmosphere.

14. The method according to claim 12, wherein the annealing is conducted at a temperature in the range of 300 to 500° C.

15. The method according to claim 12, wherein the annealing is conducted under pressure in the range of 1~760 Torr.

16. The method according to claim 12, wherein the annealing is conducted for a duration in the range of 1~100 seconds.

17. The method according to claim 12, wherein the annealing is conducted using oxygen in the range of 1~500 sccm and argon gas in the range of 100~1,000 sccm.

18. The method according to claim 9, wherein the $Ru_xO_y$ layer is formed to have a thickness in the range of 2~25 Å.

19. The method according to claim 9, wherein the $Ru_xO_y$ layer is formed as a layer in which x has a range of 0.1~0.5 and y has a range of 0.5~0.9.

20. The method according to claim 9, wherein the $Ir_xO_y$ layer is formed to have a thickness in the range of 5~100 Å.

21. The method according to claim 9, wherein the $Ir_xO_y$ layer is formed as a layer in which x has a range of 0.1~0.5 and y has a range of 0.5~0.9.

22. The method according to claim 9, wherein the Ti layer is formed to have a thickness in the range of 5~50 Å.

23. The method according to claim 9, wherein the metal layer comprises a copper layer, and the metal layer is formed to fill the metal line forming region.

* * * * *